United States Patent
LeBoeuf, II

(10) Patent No.: US 7,259,632 B1
(45) Date of Patent: Aug. 21, 2007

(54) METHOD FOR CASCODING AMPLIFIERS BY MODULATING ISOLATED POWER SUPPLY REFERENCE POINTS

(75) Inventor: Robert J. LeBoeuf, II, Salem, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 195 days.

(21) Appl. No.: 11/197,930

(22) Filed: Aug. 5, 2005

(51) Int. Cl.
*H03F 3/04* (2006.01)

(52) U.S. Cl. ...................... 330/310; 330/311
(58) Field of Classification Search .............. 330/311, 330/310, 98, 150
See application file for complete search history.

(56) References Cited

U.S. PATENT DOCUMENTS

| | | |
|---|---|---|
| 4,068,182 A | 1/1978 | Dingwall et al. |
| 4,454,480 A * | 6/1984 | Allfather et al. ............ 330/297 |
| 4,588,956 A * | 5/1986 | de Corlieu et al. ............. 330/2 |
| 6,163,211 A | 12/2000 | Morrish |
| 6,445,247 B1 * | 9/2002 | Walker ........................ 330/10 |
| 6,590,456 B2 | 7/2003 | Yang |

* cited by examiner

*Primary Examiner*—Henry Choe
(74) *Attorney, Agent, or Firm*—Patent Law Group LLP; Carmen C. Cook

(57) ABSTRACT

A method for cascading a first amplifier stage and a second amplifier stage includes coupling the output terminal of the first amplifier stage to the power supply reference point of the second amplifier stage, modulating the power supply reference point of the second amplifier stage using the output current of the first amplifier stage, and generating a final output voltage at the output terminal of the second amplifier stage having a first voltage value relative to the power supply reference point of the first amplifier stage. The first voltage value is the sum of the output voltage of the first amplifier stage relative to its own power supply reference point and the output voltage of the second amplifier stage relative to its own power supply reference point. In one embodiment, the power supply reference point is the ground reference of the power source in the amplifier stage.

19 Claims, 1 Drawing Sheet

METHOD FOR CASCODING AMPLIFIERS BY MODULATING ISOLATED POWER SUPPLY REFERENCE POINTS

FIELD OF THE INVENTION

The invention relates to amplifier circuits and, in particular, to a method of cascoding amplifiers by modulating isolated power supply reference points.

DESCRIPTION OF THE RELATED ART

Cascade amplifiers and cascode amplifiers configured to obtain the desired output voltage or output current response with the desired input/output characteristics are known. In general, amplifiers are cascaded to increase the output voltage. Furthermore, amplifiers are cascoded to increase the output impedance.

FIG. 1 is a schematic diagram of a typical amplifier circuit configuration. Referring to FIG. 1, a power source P1 supplies power to an amplifier A1. Specifically, power source P1 provides positive and negative operating potentials Vcc and Vee respectively to amplifier A1. Amplifier A1 provides an output current Io in response to an input signal and the output current Io is delivered to a load L1. Load L1 is coupled between the output terminal of amplifier A1 and a load reference Ref1. A feedback circuit F1 is coupled to receive a control signal S1 and an input signal I3 and to generate the positive and negative input signals I1 and I2, respectively, for amplifier A1. Specifically, feedback circuit F1 includes feedback circuitry, filters and an input network. Input signal I3 is a signal indicative of the output current Io and represents a feedback signal coupled to feedback circuit F1 to control signals I1 and I2 of Amplifier A1 so that the desired output current Io is maintained.

In operation, amplifier A1 responds to changes in the positive input signal I1 and the negative input signal I2 with respect to power supply voltages Vcc and Vee and furthermore to an internal reference point I5, which is typically the internal ground reference of the amplifier stage. The internal reference point I5 is typically connected to the reference point Ref2 of power source P1. Power source P1 providing positive and negative operating potentials may provide an I/O pin for its ground reference or a reference tap can be coupled to the power source to function as the power source's ground reference.

One problem of cascading the amplifier circuit in FIG. 1 is that when multiple amplifier circuits are cascoded, the maximum final output voltage achieved is limited to the power supply voltages Vcc and Vee. A method of cascading the amplifier circuits while allowing output voltage magnification is desired.

SUMMARY OF THE INVENTION

According to one embodiment of the present invention, a method for cascoding a first amplifier stage and a second amplifier stage is disclosed. Each amplifier stage is coupled to a power source providing a power supply voltage and a power supply reference point and each amplifier stage includes an output terminal providing an output current and an output voltage relative to its own power supply reference point. The output terminal of the second amplifier stage is to be coupled to drive a load. The method includes coupling the output terminal of the first amplifier stage to the power supply reference point of the second amplifier stage, modulating the power supply reference point of the second amplifier stage using the output current of the first amplifier stage, and generating a final output voltage at the output terminal of the second amplifier stage having a first voltage value relative to the power supply reference point of the first amplifier stage. The first voltage value is the sum of the output voltage of the first amplifier stage relative to its own power supply reference point and the output voltage of the second amplifier stage relative to its own power supply reference point.

In one embodiment, the power source in each amplifier stage provides a positive power supply voltage and a negative power supply voltage. The final output voltage has voltage variations between the sum of the positive power supply voltages and the sum of the negative power supply voltages of the first and second amplifier stages.

In another embodiment, the power supply reference point is a ground reference.

According to another aspect of the present invention, an amplifier circuit includes N amplifier stages where each amplifier stage includes a power source providing a power supply voltage and a power supply reference point, a feedback circuit receiving a control signal and a feedback signal where the feedback signal is indicative of the output current value and the feedback circuit generates first and second amplifier control signals, and an amplifier receiving the power supply voltage from the power source and the first and second amplifier control signals from the feedback circuit. The amplifier has an output terminal providing an output current and an output voltage relative to the power supply reference point of the associated power source. The output terminal of each of the first to the (N−1)th amplifier stages is coupled to the power supply reference point of the next amplifier stage so that the power supply reference point of the second to the Nth amplifier stages is modulated by the output current of the previous amplifier stage. A final output voltage at the output terminal of the Nth amplifier stage has a first voltage value relative to the power supply reference point of the first amplifier stage where the first voltage value is the sum of the output voltages of all of the N amplifier stages relative to its own power supply reference point.

The present invention is better understood upon consideration of the detailed description below and the accompanying drawings.

DETAILED DESCRIPTION OF THE PREFERRED EMBODIMENTS

In accordance with the principles of the present invention, a method for cascading two amplifiers involves modulating a power supply reference point (such as the ground reference) of a first amplifier using a second amplifier. The output voltage of the amplifier circuit thus formed is the sum of the output voltages provided by each amplifier stage. By modulating the power supply reference point of one amplifier stage using another amplifier stage, output voltage magnification greater than the individual power supply voltages can be achieved. In other embodiments, the cascode configuration of the present invention can be extended to include multiple amplifier stages to realize unlimited output voltage magnification.

More specifically, when the amplifier stage incorporates an isolated power supply, the power supply reference point of the isolated power supply can be modulated to provide a signal that is added to the modulation source where the modulation source is implemented by another amplifier stage. Two or more amplifier stages are thus cascoded to realize output voltage magnification. In the present description, the power supply reference point refers to a reference voltage of a power supply, usually the ground voltage reference.

Figure 1:
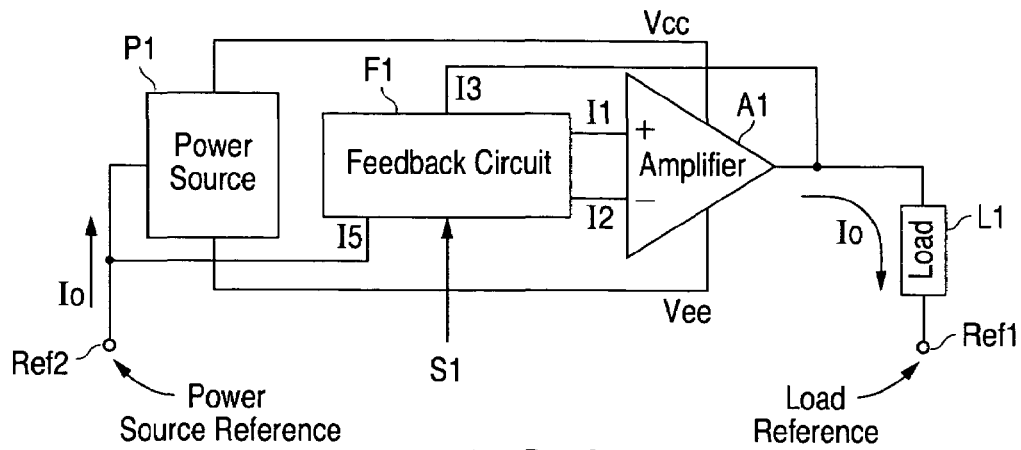
FIG. 1 is a schematic diagram of a typical amplifier circuit configuration.
Figure 2:
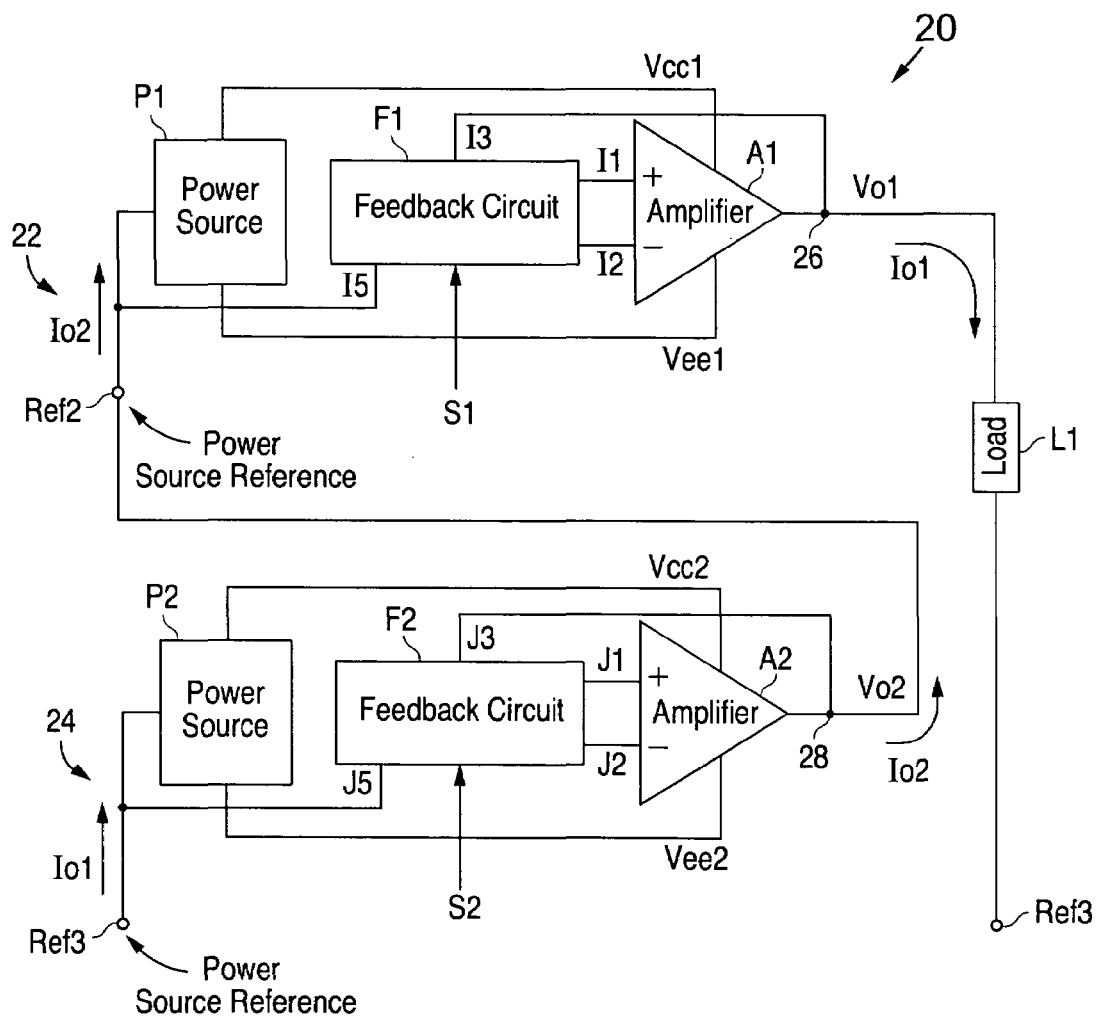
FIG. 2 is a schematic diagram of a cascoded amplifier circuit according to one embodiment of the present invention.

FIG. 2 is a schematic diagram of a cascoded amplifier circuit according to one embodiment of the present invention. Referring to FIG. 2, amplifier circuit 20 includes a first amplifier stage 22 and a second amplifier stage 24 connected in a cascode configuration. Amplifier circuit 20 provides an output current Io1 for driving a load L1.

First amplifier stage 22 includes a power source P1 (or power supply P1) which is an isolated power supply with a power supply reference point Ref2, typically the power supply's ground reference. Power source P1 provides positive and negative operating voltages Vcc1 and Vee1, respectively, to power amplifier A1. First amplifier stage 22 also includes a feedback circuit F1 receiving a control signal S1 and an input signal I3 as inputs. Input signal I3 is indicative of the output current Io1 of amplifier A1 and is a feedback signal to feedback circuit F1. Feedback circuit F1 typically includes feedback circuitry, filters and an input network. In response to input signal I3 and control signal S1, feedback circuit F1 generates a pair of positive and negative input signals I1 and I2 coupled to drive amplifier A1 for generating the output current Io1 on an output terminal 26. When output current Io1 of amplifier A1 is coupled to drive a load L1, an output voltage Vo1 develops across load L1. In the present configuration, load L1 is connected between the output terminal 26 of amplifier A1 and a reference point Ref3, typically a ground reference. The output voltage Vo1 thus has a voltage value relative to ground reference Ref3.

Second amplifier stage 24 is constructed in the same manner as first amplifier stage 22. Second amplifier stage 24 includes a power source P2 (or power supply P2) which is an isolated power supply with a power supply reference point Ref3, typically the power supply's ground reference. Power source P2 provides positive and negative operating voltages Vcc2 and Vee2, respectively, to power amplifier A2. Second amplifier stage 24 also includes a feedback circuit F2 receiving a control signal S2 and an input signal J3 as inputs. Input signal J3 is indicative of the output current Io2 of amplifier A2 and is a feedback signal to feedback circuit F2. Feedback circuit F2 typically includes feedback circuitry, filters and an input network. In response to input signal J3 and control signal S2, feedback circuit F2 generates a pair of positive and negative input signals J1 and J2 coupled to drive amplifier A2 for generating the output current Io2 on an output terminal 28.

Each amplifier stage operates to generate an output current in response to the control signal and the feedback signal. In the first amplifier stage 22, amplifier A1 responds to changes in the positive input signal I1 and the negative input signal I2 with respect to power supply voltages Vcc1 and Vee1 and furthermore to an internal reference point I5, which is typically an internal ground reference. The internal reference point I5 is connected to the reference point Ref2 of power source P1. Similarly, in the second amplifier stage 24, amplifier A2 responds to changes in the positive input signal J1 and the negative input signal J2 with respect to power supply voltages Vcc2 and Vee2 and furthermore to an internal reference point J5, which is typically an internal ground reference. The internal reference point J5 is connected to the reference point Ref3 of power source P2.

In accordance with the present invention, first amplifier stage 22 and second amplifier stage 24 are connected in a cascode configuration so that the first amplifier stage will provide an output voltage Vo1 relative to the load ground reference Ref3 that is the sum of the output voltage of the first amplifier A1 relative to its own power supply reference point Ref2 and the output voltage of the second amplifier A2 relative to its own power supply reference point Ref3. In this manner, a magnified output voltage is provided to load L1.

In accordance with the amplifier cascading method of the present invention, the power supply reference point Ref2 of the first amplifier stage is modulated by the second amplifier stage 24. Specifically, the output terminal 28 of the second amplifier stage 24 is coupled to node associated with the power supply reference point Ref2 (the ground reference) of power source P1 of the first amplifier stage 22. The output current Io2 of amplifier A2 thus drives the power supply reference point Ref2 of the first amplifier stage 22. Amplifier A2 provides an output voltage Vo2 having a first voltage value relative to the ground reference Ref3 of power source P2. The output voltage Vo2 has a variation between the power supply voltages Vcc2 and Vee2.

On the other hand, as thus driven, amplifier A1 provides an output voltage Vo1 having a second voltage value relative to the ground reference Ref2 of its own power source P1. The second voltage value of the output voltage Vo1 varies between the power supply voltages Vcc1 and Vee1. When the output terminal 26 of amplifier A1 is coupled to drive load L1 coupled to ground reference Ref3, the output voltage Vo1 has a third voltage value relative to the ground reference Ref3. Specifically, the third voltage value is the sum of the first voltage value and the second voltage value. Thus, output voltage Vo1 across load L1 can have a voltage value variation between Vcc1+Vcc2 and Vee1+Vee2.

In one embodiment, power source P1 and power source P2 provide the same power supply voltages. Thus, voltage Vcc1 equals to voltage Vcc2 and voltage Vee1 equals to voltage Vee2. Amplifier circuit 20 cascoding the two amplifier stages thus achieve voltage doubling. Output voltage Vo1 can have a voltage value relative to ground reference Ref3 equaling two times Vcc1 or two times Vee1. In other embodiments, the power supply voltages provided by power source P1 and power source P2 can be different as long as power source P2 provides power supply voltages greater than the power supply voltages provided by power source P1. In this case, amplifier circuit 20 provides an output voltage across load L1 having voltage variations between the sum of the positive power supply voltages and the sum of the negative power supply voltages of the two power sources P1 and P2.

In operation, first amplifier stage 22 generates output current Io1 which flows through the load L1 into reference point Ref3. Reference point Ref3 is the same reference point Ref3 of power source P2 of the second amplifier stage 24. The current Io1 then flows through either voltage Vcc2 or voltage Vee2 and emerges as the output current Io2 of amplifier A2. Output current Io2 returns to power source P1 through the cascode connection. Output current Io2 then flows through voltage Vcc1 or Vee1 and emerges as the output current Io1 of amplifier A1. In this manner, the current completes the round trip through the cascoded amplifiers A1 and A2 and voltage magnification is effectively achieved. In particular, since the control signal S1 to amplifier A1 is a signal referenced to reference point Ref3, amplifier A1 responds to control signal S1, causing output current Io1 to flow.

In FIG. 2, the cascoding method is applied to two amplifier stages only. In other embodiments, the cascoding method can be expanded to include multiple amplifier stages to achieve unlimited voltage magnification. Specifically, in one embodiment, N amplifier stages are cascoded in accordance with the present invention. The first amplifier stage 1N in the chain has a power supply reference point denoted as Ref1N. The output terminal of the first amplifier stage 1N drives the power supply reference point for the next amplifier stage. Each successive amplifier stage is thus driven so that the last amplifier stage NN in the chain provides an output voltage Vo having a voltage value relative to the power supply reference point Ref1N that is equal to the sum of the output voltage of each amplifier stage relative to its own power supply reference point. The final output voltage Vo for the N amplifier stages relative to the power supply reference point Ref1N of the first amplifier stage 1N has variations between the sum of all the positive power supply voltages and the sum of all the negative power supply voltages of the N amplifier stages.

The above detailed descriptions are provided to illustrate specific embodiments of the present invention and are not intended to be limiting. Numerous modifications and variations within the scope of the present invention are possible. The present invention is defined by the appended claims.

I claim:

1. A method for cascading a first amplifier stage and a second amplifier stage, each amplifier stage being coupled to a power source providing a power supply voltage and a power supply reference point, each amplifier stage including an output terminal providing an output current and an output voltage relative to its own power supply reference point, the output terminal of the second amplifier stage to be coupled to drive a load, the method comprising:

coupling the output terminal of the first amplifier stage to the power supply reference point of the second amplifier stage;

modulating the power supply reference point of the second amplifier stage using the output current of the first amplifier stage; and generating a final output voltage at the output terminal of the second amplifier stage having a first voltage value relative to the power supply reference point of the first amplifier stage, the first voltage value being the sum of the output voltage of the first amplifier stage relative to its own power supply reference point and the output voltage of the second amplifier stage relative to its own power supply reference point.

2. The method of claim 1, wherein the power source in each amplifier stage provides a positive power supply voltage and a negative power supply voltage, the final output voltage having voltage variations between the sum of the positive power supply voltages and the sum of the negative power supply voltages of the first and second amplifier stages.

3. The method of claim 1, wherein the power supply reference point comprises a ground reference.

4. The method of claim 1, wherein the power supply voltages provided by the power sources in the first and second amplifier stages have the same voltage values.

5. The method of claim 1, wherein the power supply voltages provided by the power sources in the first and second amplifier stages have different voltage values.

6. The method of claim 1, wherein each amplifier stage generates an output current and an output voltage relative to its own power supply reference point in response to a control signal and a feedback signal, the feedback signal being indicative of the output current value.

7. The method of claim 1, further comprising:

coupling the power supply reference point of the first amplifier stage as the reference point of the load; and applying the final output voltage across the load.

8. A method for cascading N amplifier stages, each amplifier stage being coupled to a power source providing a power supply voltage and a power supply reference point, each amplifier stage including an output terminal providing an output current and an output voltage relative to its own power supply reference point, the output terminal of the Nth amplifier stage to be coupled to drive a load, the method comprising:

coupling the output terminal of each amplifier stage of the first to the (N−1)th amplifier stages to the power supply reference point of the next amplifier stage;

modulating the power supply reference point of each of the second to the Nth amplifier stages using the output current of the previous amplifier stage; and generating a final output voltage at the output terminal of the Nth amplifier stage having a first voltage value relative to the power supply reference point of the first amplifier stage, the first voltage value being the sum of the output voltages of all of the N amplifier stages relative to its own power supply reference point.

9. The method of claim 8, wherein the power source in each amplifier stage provides a positive power supply voltage and a negative power supply voltage, the final output voltage having voltage variations between the sum of the positive power supply voltages and the sum of the negative power supply voltages of the N amplifier stages.

10. The method of claim 8, wherein the power supply reference point comprises a ground reference.

11. The method of claim 8, wherein each amplifier stage generates an output current and an output voltage relative to its own power supply reference point in response to a control signal and a feedback signal, the feedback signal being indicative of the output current value.

12. The method of claim 8, wherein the power supply voltages provided by the power sources in the N amplifier stages have the same voltage values.

13. The method of claim 8, wherein the power supply voltages provided by the power sources in some of the N amplifier stages have different voltage values.

14. The method of claim 8, further comprising:

coupling the power supply reference point of the first amplifier stage as the reference point of the load; and applying the final output voltage across the load.

15. An amplifier circuit comprising:

a plurality of N amplifier stages, each amplifier stage comprising:

a power source providing a power supply voltage and a power supply reference point;

a feedback circuit receiving a control signal and a feedback signal, the feedback signal being indicative of the output current value, the feedback circuit generating first and second amplifier control signals; and an amplifier receiving the power supply voltage from the power source and the first and second amplifier control signals from the feedback circuit, the amplifier having an output terminal providing an output current and an output voltage relative to the power supply reference point of the associated power source, wherein the output terminal of each of the first to the (N−1)th amplifier stages is coupled to the power supply reference point of the next amplifier stage, the power supply reference point of the second to the Nth amplifier stages being modulated by the output current of the previous amplifier stage, and wherein a final output voltage at the output terminal of the Nth amplifier stage has a first voltage value relative to the power supply reference point of the first amplifier stage, the first voltage value being the sum of the output voltages of all of the N amplifier stages relative to its own power supply reference point.

16. The amplifier circuit of claim 15, wherein the power source in each amplifier stage provides a positive power supply voltage and a negative power supply voltage, the final output voltage having voltage variations between the sum of the positive power supply voltages and the sum of the negative power supply voltages of the N amplifier stages.

17. The amplifier circuit of claim 15, wherein the power supply reference point comprises a ground reference.

18. The amplifier circuit of claim 15, wherein the power supply voltages provided by the power sources in the N amplifier stages have the same voltage values.

19. The amplifier circuit of claim 15, wherein the power supply voltages provided by the power sources in some of the N amplifier stages have different voltage values.

* * * * *

UNITED STATES PATENT AND TRADEMARK OFFICE
CERTIFICATE OF CORRECTION

| | | |
|---|---|---|
| PATENT NO. | : 7,259,632 B1 | Page 1 of 1 |
| APPLICATION NO. | : 11/197930 | |
| DATED | : August 21, 2007 | |
| INVENTOR(S) | : Robert J. LeBoeuf II | |

It is certified that error appears in the above-identified patent and that said Letters Patent is hereby corrected as shown below:

Column 5, line 31, claim 1: Cancel "cascading" and substitute --cascoding--.

Column 6, line 11, claim 8: Cancel "cascading" and substitute --cascoding--.

Signed and Sealed this

Sixteenth Day of September, 2008

JON W. DUDAS
*Director of the United States Patent and Trademark Office*